(12) United States Patent
Goenka et al.

(10) Patent No.: US 6,248,247 B1
(45) Date of Patent: Jun. 19, 2001

(54) METHOD OF FORTIFYING AN AIR BRIDGE CIRCUIT

(75) Inventors: Lakhi Nandlal Goenka, Ann Arbor; Mohan R. Paruchuri, Canton, both of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/203,146

(22) Filed: Dec. 1, 1998

(51) Int. Cl.[7] .................................................... H01B 13/00

(52) U.S. Cl. .............................. 216/15; 427/404; 427/405

(58) Field of Search ............................... 216/15; 427/404, 427/405, 406; 156/629.1; 361/8; 257/762, 727, 776, 276

(56) References Cited

U.S. PATENT DOCUMENTS

| | | |
|---|---|---|
| 3,801,388 | 4/1974 | Akiyama et al. . |
| 4,404,059 | 9/1983 | Livshits et al. . |
| 5,148,260 | * 9/1992 | Inoue et al. .......................... 257/762 |
| 5,738,797 | 4/1998 | Belke, Jr. et al. . |

FOREIGN PATENT DOCUMENTS

| | | | |
|---|---|---|---|
| 62-060241A | * 3/1987 | (JP) | ............................... H01L/21/88 |
| 01144656A | * 6/1989 | (JP) | ............................... H01L/21/90 |

* cited by examiner

Primary Examiner—Gregory Mills
Assistant Examiner—P. Hassanzadeh
(74) Attorney, Agent, or Firm—Steven L. Oberholtzer; Brinks Hofer Gilson & Lione

(57) ABSTRACT

There is disclosed herein a multilayer circuit board having air bridge crossover structures and a subtractive method for producing the same, wherein the circuit includes specially designed metallic fortifying layers which provide mechanical and/or electrical fortification to the circuit.

12 Claims, 7 Drawing Sheets

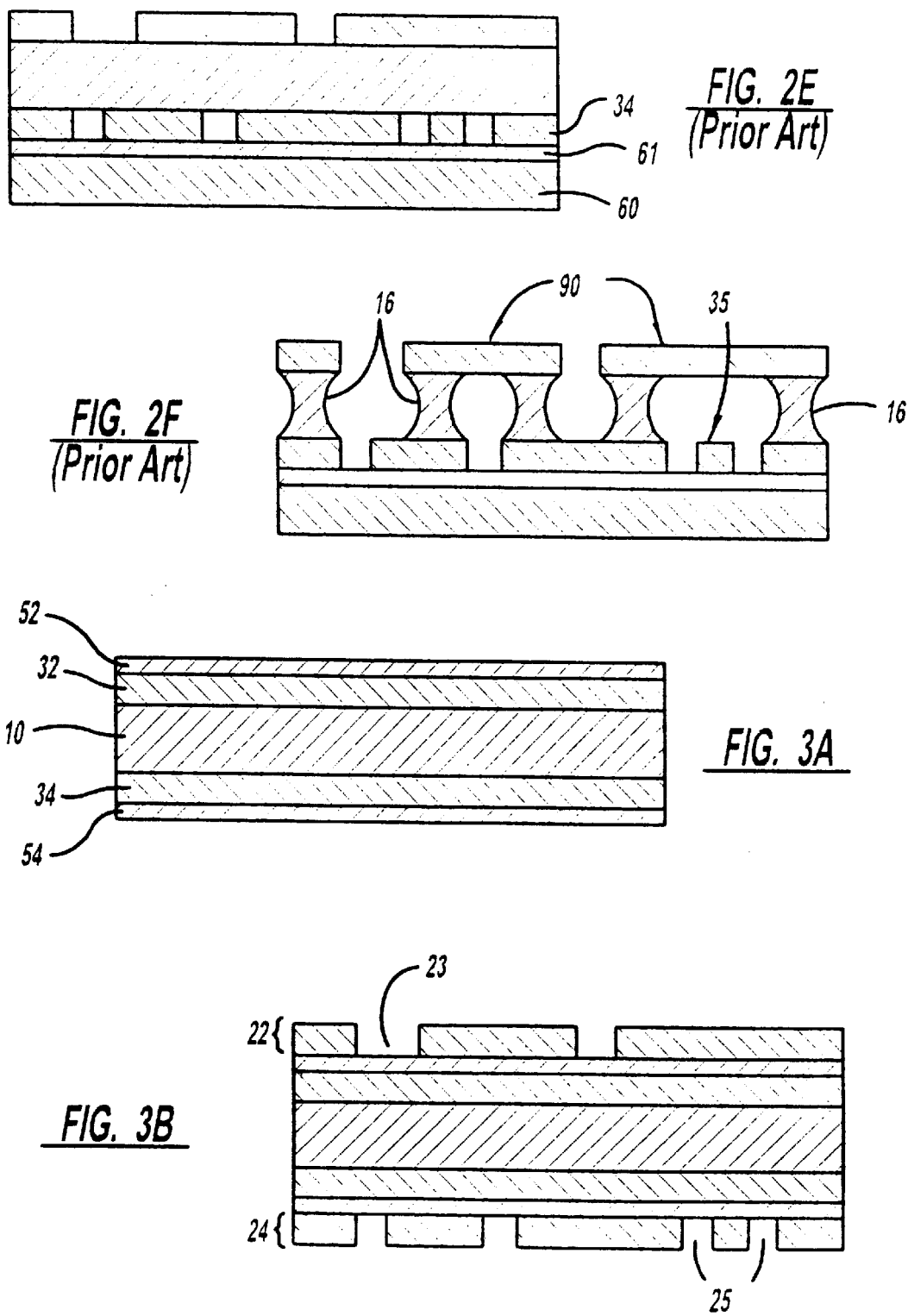

US 6,248,247 B1

METHOD OF FORTIFYING AN AIR BRIDGE CIRCUIT

BACKGROUND OF THE INVENTION

1. Field of the Invention

The present invention relates generally to circuit boards, and more particularly to multilayer circuit boards having air bridge crossover circuits.

2. Disclosure Information

In the field of electronics manufacturing, various additive and subtractive processes are known for constructing printed circuit boards (PCBs). Among these are the processes disclosed in U.S. Pat. Nos. 4,404,059 to Livshits et al. (hereinafter"Livshits"), U.S. Pat. No. 3,801,388 to Akiyama et al. (hereinafter"Akiyama"), and U.S. Pat. No. 5,738,797 to Belke et al. (hereinafter "Belke"), all three of which are incorporated herein by reference. These sources describe various additive and subtractive plating and chemical etching processes for constructing multilayer (i.e., two-or-more-layer) circuit boards having air bridges.

As typified in FIGS. 1A and 2A–F (and in FIGS. 1A–D of Akiyama), the subtractive process involves the following steps. First (FIG. 2A), a tri-metal-layer laminate is provided, comprising a central layer 10 made of a first metal, and upper and lower conductor network layers 32/34 made of a second metal. This tri-metal-laminate may be produced by cladding the second-metal upper and lower layers onto the first-metal central layer, or by panel-plating the second metal onto top and bottom surfaces of a first-metal foil, or the like. Second (FIG. 2B), upper and lower etch-resist masks 22/24 are disposed on the exposed surfaces of the upper and lower conductor network layers 32/34. The upper and lower masks 22/24 correspond to predefined upper and lower circuit patterns to be formed in the respective conductor network layers 32/34. The masks 22/24 also have respective apertures 23/25 therein through which portions of the conductor network layers are exposed. third (FIG. 2C), the masked laminate is exposed to an etchant which etches substantially only the second metal (without appreciably etching the first metal), such that the portions of the second metal exposed through the mask apertures are etched away. Fourth (FIG. 2D), the masks are stripped off, fifth (FIG. 2E), the structure is attached to an electrically insulative surface 61 of a substrate 60, and sixth (FIG. 2F) the structure is exposed to an etchant which etches substantially only the first metal, so as to etch away substantially all of the metal foil except for those portions 16 sandwiched between the top and bottom conductor networks. These sandwiched portions 16 are much less aggressively etched because the top and bottom conductor networks act essentially as etch-resist masks, since the metal of these networks is not appreciably etched by the aforementioned etchant. After etching, these sandwiched portions 16 typically assume an hour-glass-like shape, and are referred to as "pedestals", "support elements", or the like.

An advantage that air bridge crossover circuits provide over conventional FR-4 PCBs is that they facilitate high density circuits—that is, they permit the arrangement of a high number of circuit traces and other circuit elements into a small circuit board area. However, such circuits are often susceptible to mechanical damage (e.g., from impact, thermal excursions, and the like) and/or to poor electrical performance (e.g., caused by the use of certain metals having poor electrical conductance characteristics as the conductor network material). Thus, it would be desirable to provide a way of producing such multilayer air bridge circuits without these drawbacks.

SUMMARY OF THE INVENTION

The present invention overcomes the disadvantages of prior art approaches by providing a multilayer air bridge circuit structure, and a method for producing the same, which has special metallic fortifying layers that help mitigate the aforementioned drawbacks.

It is an object and advantage that the present invention includes fortifying layers made of a metal selected such that the air bridge structure is mechanically and/or electrically fortified.

Another advantage is that the present invention may be easily and economically incorporated into a conventional subtractive air bridge circuit construction process.

These and other advantages, features and objects of the invention will become apparent from the drawings, detailed description and claims which follow.

BRIEF DESCRIPTION OF THE DRAWINGS

FIGS. 2A–F are successive sectional side views of a multilayer air bridge circuit being produced according to the prior art.

FIGS. 3A–G are successive sectional side views of a multilayer air bridge circuit being produced according to the present invention.

DETAILED DESCRIPTION OF THE PREFERRED EMBODIMENTS

Figure 3C:
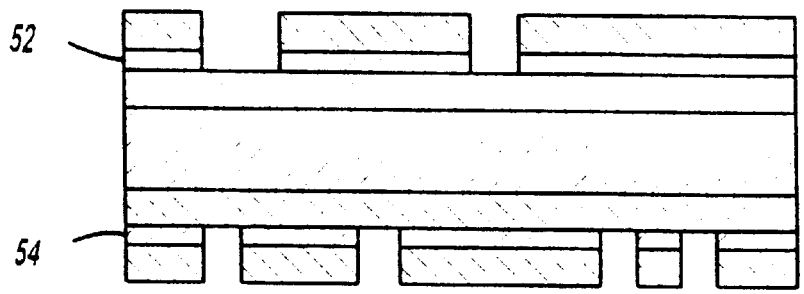
Figure 3D:
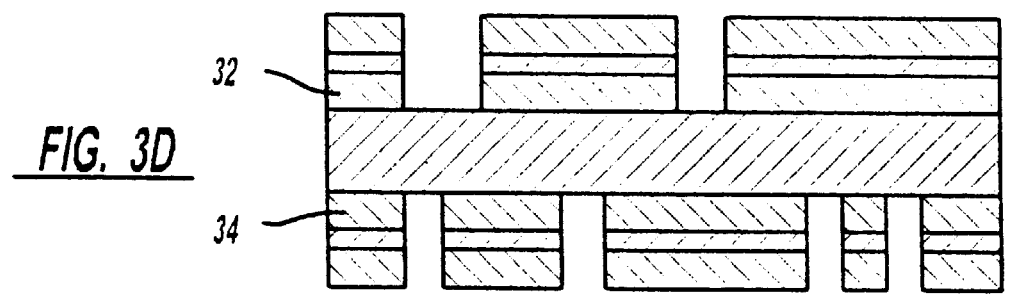
Figure 3E:
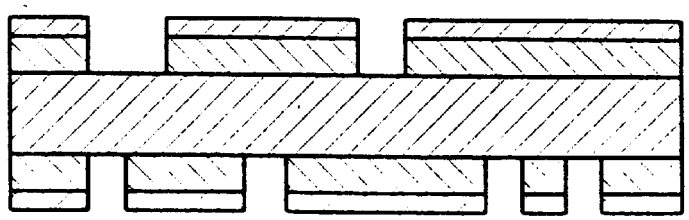
Figure 3F:
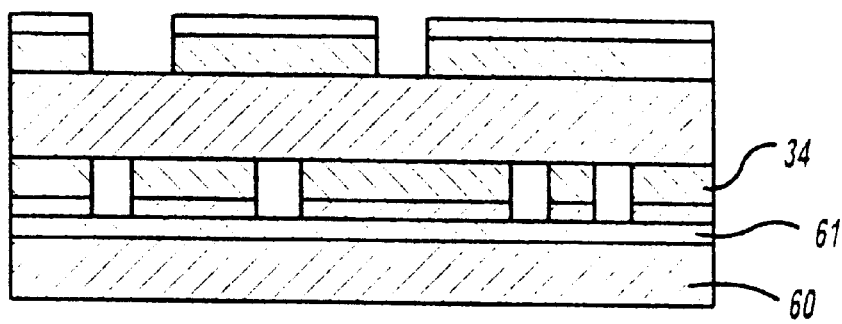
Figure 3G:
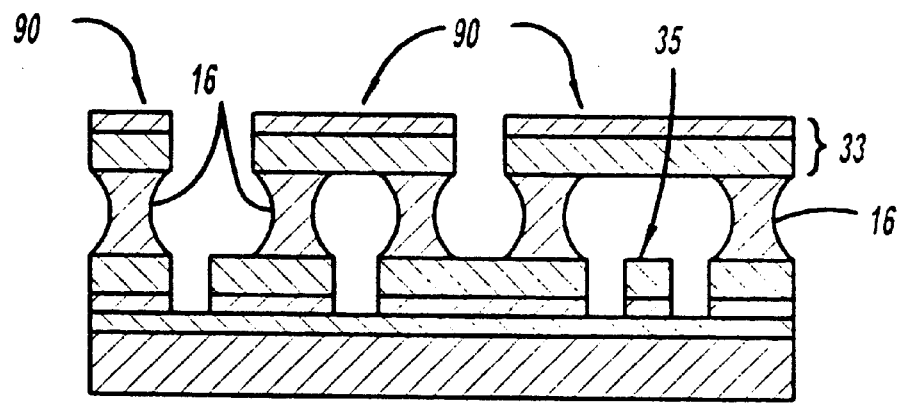
Figure 4:
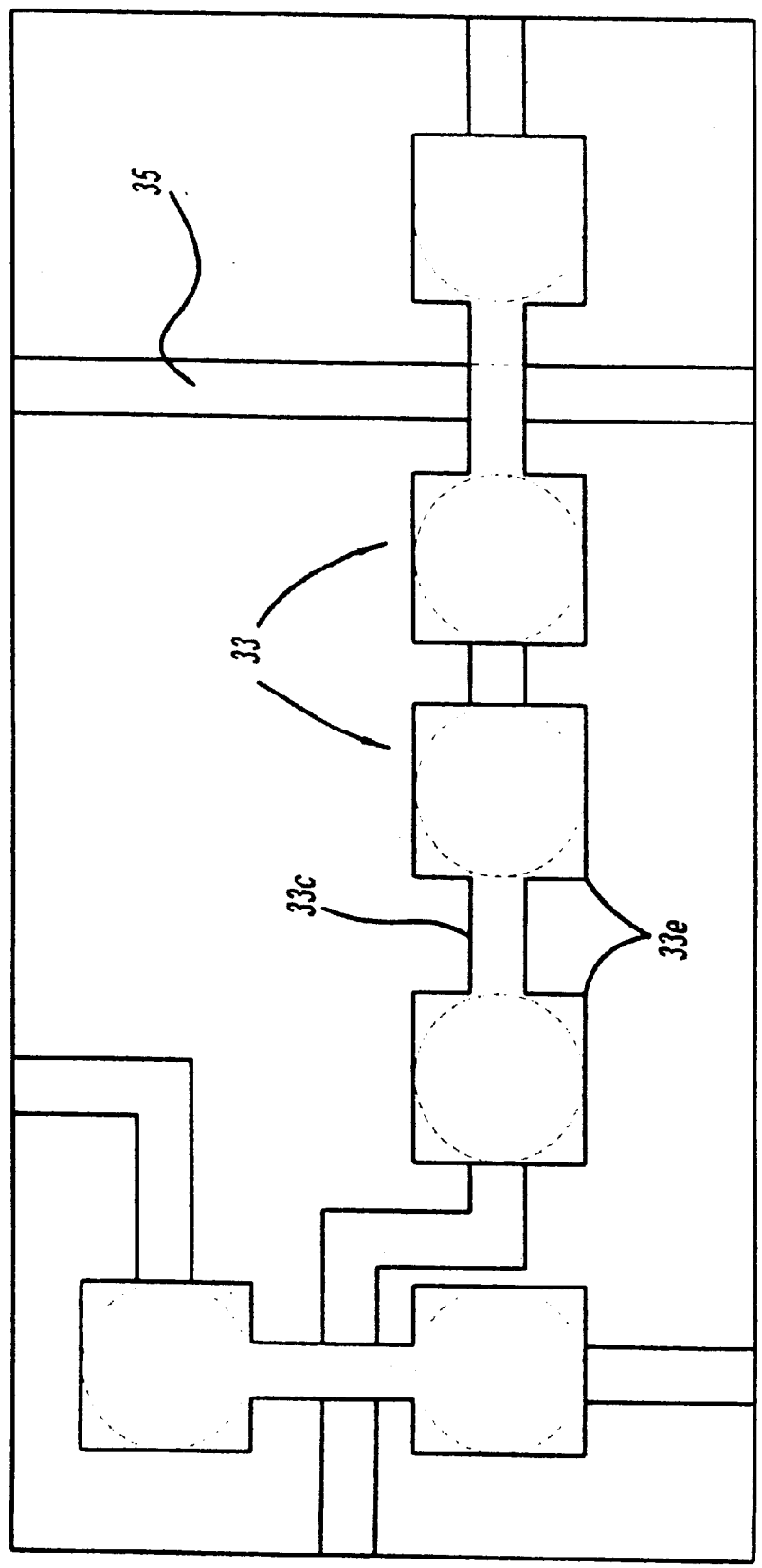
FIG. 4 is a top view of the circuit of FIG. 3G.

Turning now to the drawings, FIGS. 1B and 3A–G illustrate a process for producing a multilayer circuit board having air bridge crossovers according to the present invention. This process involves the steps of: (a) providing a multilayer metal sandwich (e.g., created by cladding, panel-plating, or the like) which comprises a central layer 10 made of a first metal, top and bottom conductor network layers 32/34 made of a second metal and attached to the respective top and bottom surfaces of the central layer, and top and bottom fortifying layers 52/54 made of a third metal and attached to the respective top and bottom conductor network layers (FIG. 3A); (b) applying top and bottom etch-resist masks 22/24 to the top and bottom fortifying layers, respectively, wherein the masks are configured to correspond to respective predefined top and bottom conductor patterns, and wherein apertures 23/25 in the masks define exposed portions of the fortifying layers and conductor network layers (FIG. 3B); (c) etching away the exposed portions of the fortifying layers (FIG. 3C); (d) etching away the exposed portions of the conductor network layers (FIG. 3D); (e) stripping the masks (FIG. 3E); (f) attaching the bottom conductor network 34 to a substrate 60 through an electrically insulative adhesive 61 (FIG. 3F); and (g) etching away the central first metal layer 10 except for those portions 16 thereof sandwiched between the top and bottom conductor networks, thereby forming air bridge crossover structures 90 (FIGS. 3G and 4).

To assist the reader in understanding the present invention, all reference numbers used herein are summarized in the table below, along with the elements they represent:

10=Central foil/layer . . . [first metal]
16=Pedestal/support element of air bridge
22=Top etch-resist mask
23=Apertures in top mask
24=Bottom etch-resist mask
25=Apertures in bottom mask
32=Top conductor network . . . [second metal]
33=Bridging element in top conductor network
33e=Enlarged end of bridging element
33c=Constricted portion of bridging element
34=Bottom conductor network . . . [second metal]
35=Circuit trace
36=Support element pad
52=Top fortifying layer . . . [third metal]
54=Bottom fortifying layer . . . [third metal]
60=Substrate
61=Electrically insulative adhesive on substrate
90=Air bridge crossover structure By providing the additional fortifying layers 52/54 to the circuit, the overall circuit is mechanically and electrically fortified and enhanced. This is generally true regardless of the particular metal chosen as the fortifying layer material. In order to maximize the mechanical/electrical fortification, it is recommended that the third/fortifying metal be selected such that it has a higher flex modulus and/or a higher electrical conductance than that of the second/conductor network metal. (Either or both of these criteria may be used to select the third/fortifying metal, depending on whether it is desired to fortify the air bridge circuit primarily mechanically, electrically, or both.) For example, if it is desired to electrically fortify a Ni—Cu—Ni air bridge circuit (i.e., first metal/central foil=Cu, second metal/conductor networks=Ni) due to the poor electrical conductance of Ni, one may choose Au (gold) as a suitable third metal, because it is platable/claddable onto Ni and has much greater electrical conductance than does Ni. As another example, if it is desired to mechanically fortify a Custeel-Cu circuit (i.e., first metal=steel, second metal=Cu) due to the poor mechanical properties of Cu, one may choose Ni as a suitable third metal, because it is platable/claddable onto Cu and has a much higher flex modulus (and other enhanced mechanical properties) as compared to Cu. As yet another example, Ni may also be used as the third metal when it is desired to improve the mechanical properties of a Cu—Al—Cu circuit, because it is platable/claddable onto Cu and has a higher flex modulus than does Cu. Several other metals may be used as a suitable third/fortifying metal in each of the above examples, and there are many other first metal/second metal combinations available besides the three specifically mentioned herein, yet each of these additional combinations is within the scope of the present invention.

As known to those skilled in the art, a "conversion layer" is sometimes interposed between two layers of different metals when it may be difficult to plate/clad one of these two metals onto the other. Typically the conversion layer metal is made of yet another different metal onto which both of the first two metals may be easily plated/clad. For example, in a preferred embodiment, the metal foil 10 (first metal) may be aluminum, each conductor network layer 32/34 (second metal) may be copper, and each fortifying layer 52/54 (third metal) may be nickel; however, because it is difficult to plate or clad copper directly onto aluminum, a conversion layer (fourth metal) of zincate or silver may be applied atop the aluminum before copper plating/cladding. For this embodiment, the aluminum foil 10 is preferably about 6 mils thick, each conversion layer is only about 2–10 $\mu$in thick [e.g., 2–5 $\mu$in for zincate, or 2–10 $\mu$in for silver], each conductor network 32/34 about 2 mils thick, and each fortifying layer 52/54 up to about 1–2 mils thick. Conversion layers may be placed between the metal foil 10 and the conductor layers 32/34, and/or between the conductor layers 32/34 and the fortifying layers 52/54. Of course, a given conversion "layer" may actually comprise two or more different metal layers, depending on the particular metallurgies involved.

Figure 1A:
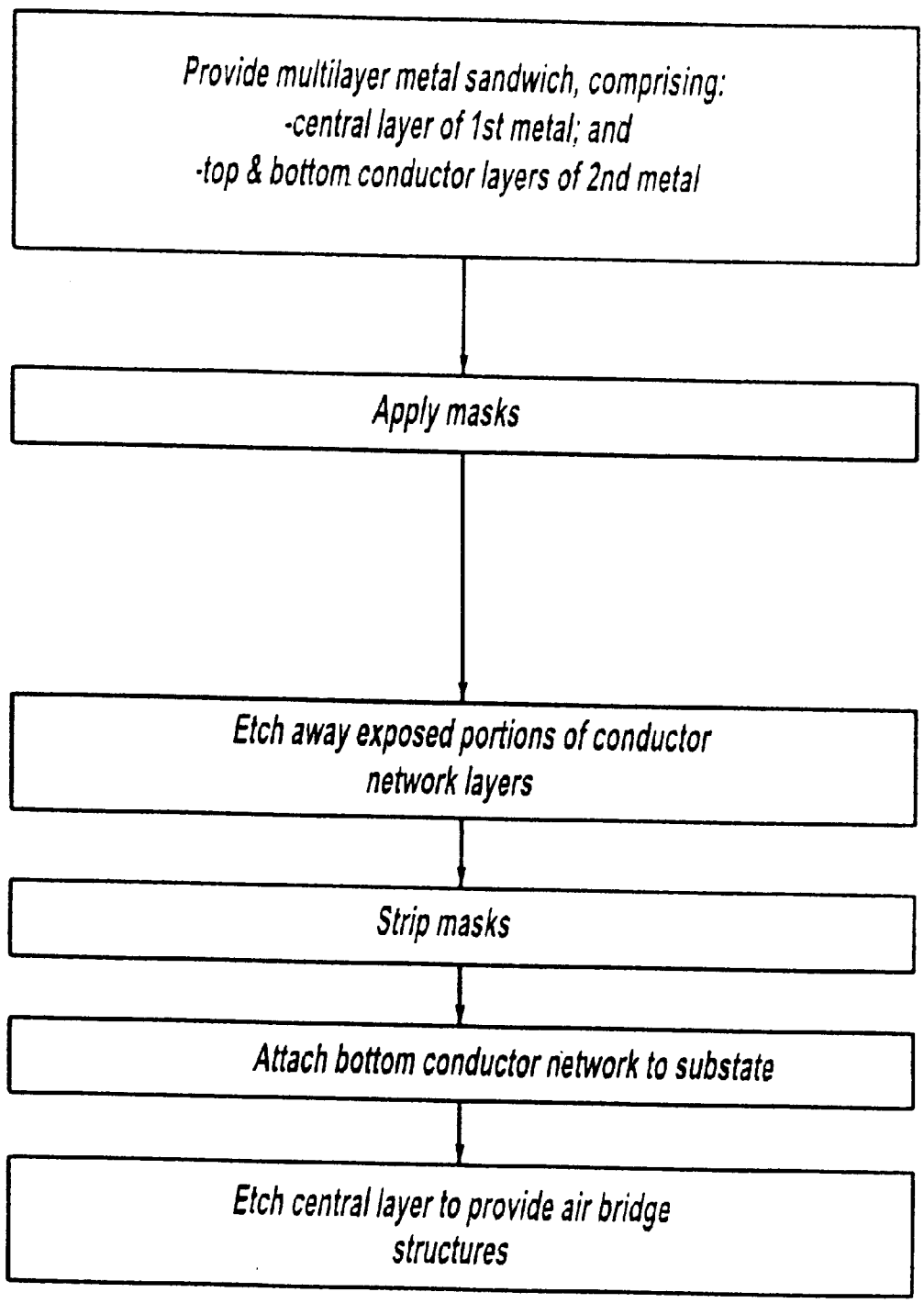
FIG. 1A is a flowchart of the steps for producing a multilayer air bridge circuit according to the prior art.
Figure 1B:
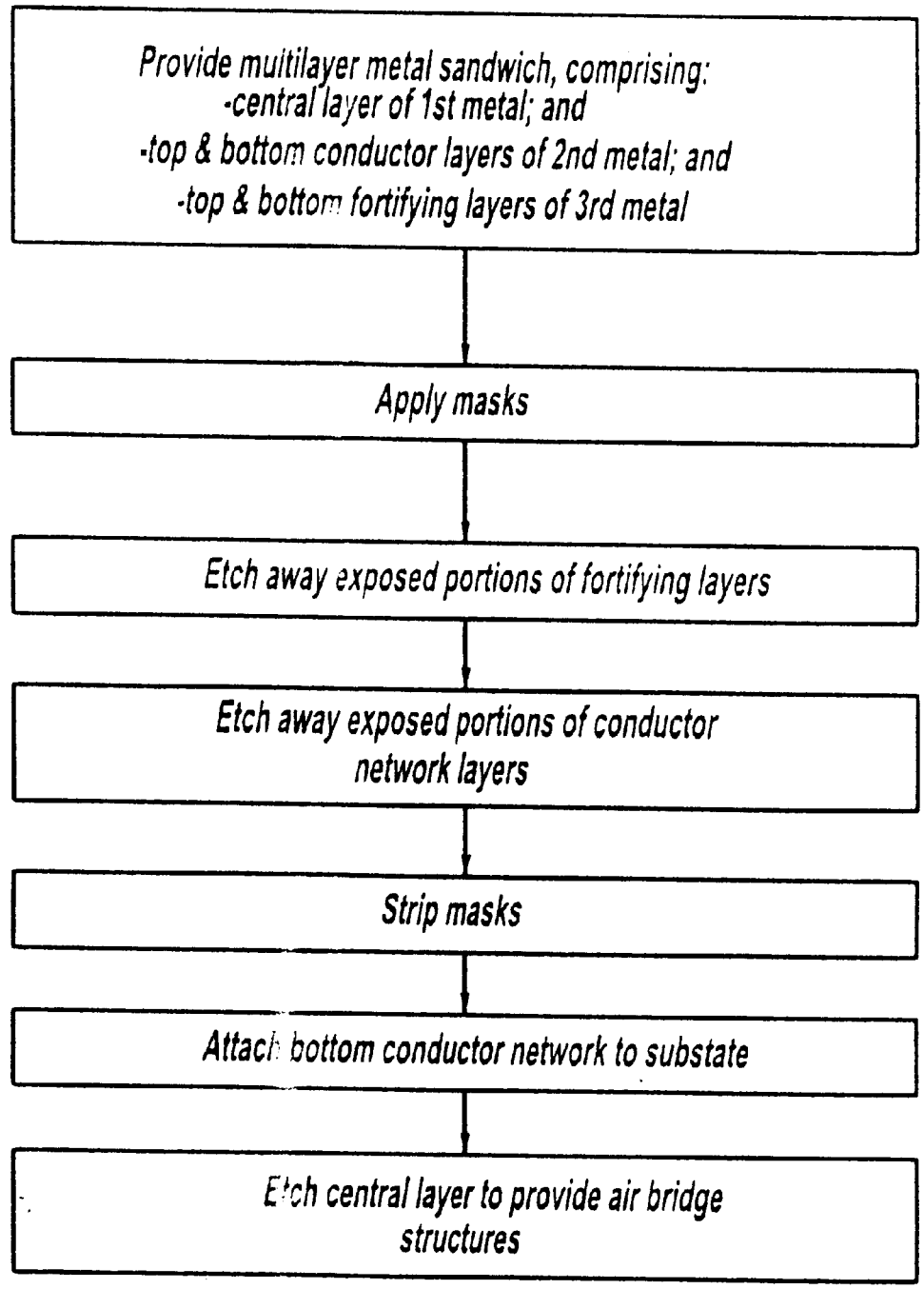
FIGS. 1B is a flowchart of the steps for producing a multilayer air bridge circuit according to the present invention.
Figure 2A:
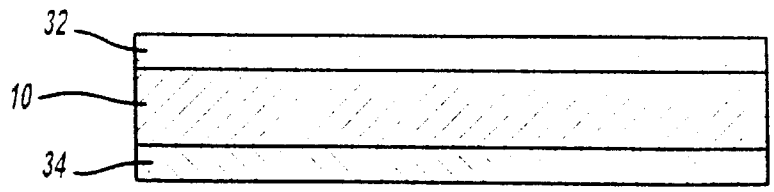
Figure 2B:
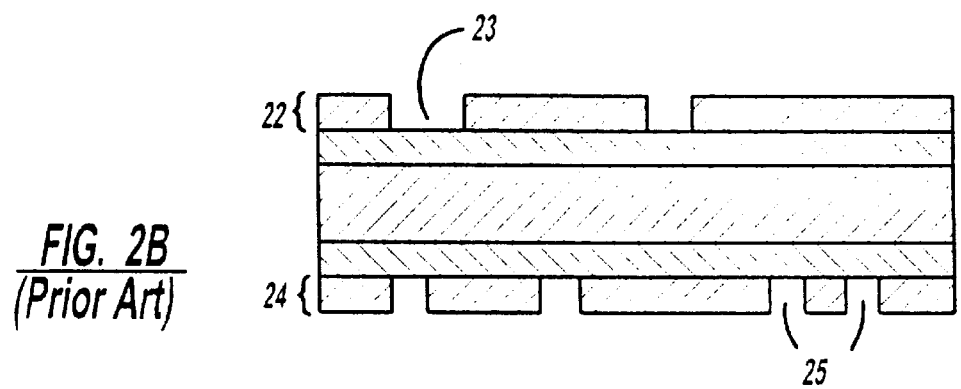
Figure 2C:
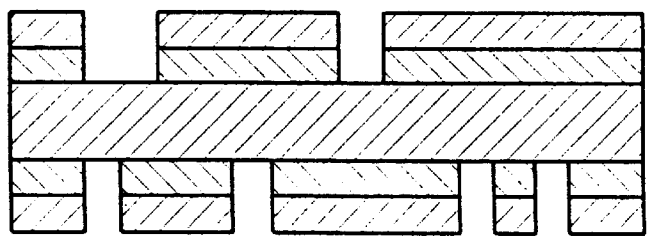
Figure 2D:
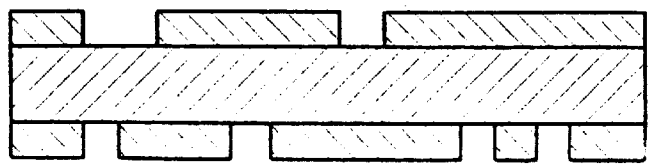

As taught in Livshits, Akiyama and Belke, the bottom conductor network 34 generally comprises a plurality of circuit traces 35 and support element pads 36; typically, the support element pads 36 are arranged in pairs proximate a corresponding circuit trace 35, with one pad 36 on either side of the trace 35. The top conductor network 32 comprises at least one bridging element 33 having first and second enlarged ends 33e with at least one constricted portion 33c contiguous with and between (i.e., connecting) the enlarged ends, such as the "dumbbell" shapes illustrated in FIG. 4 (and in FIGS. 1h and 2c of Livshits and FIGS. 2 and 3 of Akiyama). Each bridging element 33 is generally oriented transverse to a corresponding circuit trace, with each enlarged end thereof disposed opposite/atop a respective one of the support element pads.

The substrate 60 may be metal, plastic, ceramic, or any other suitable material, with the adhesive 61 being, for example, a thermoset epoxy. (It is required that the adhesive 61 be electrically insulative in order to avoid shorts among the bottom conductor network elements.) The adhesive 61 mat be a separate coating, film, or the like, or may simply represent an integral surface portion of the substrate 60, such as when the entire substrate/surface 60/61 is an epoxy potting or a thermoplastic molding, for example.

It should be noted that whenever reference is made herein to "etching" a particular layer, it is generally intended that an etchant be used which etches substantially only the metal of which that particular structure is made. For example, when it is mentioned that the metal foil 10 is to be etched, it is meant that the etchant used will etch substantially only the first metal (e.g., aluminum) and will not appreciably etch the second, third, and optional fourth metals (e.g., copper, nickel, and zincate/silver, respectively). However, for the sake of efficiency, it may be desirable to combine certain successive steps by using an etchant which etches all of the metals to be etched in such steps. For example, it may be more practical to combine the steps of etching the fortifying layers and any underlying conversion layers into a single step, using a single etchant that etches both, particularly in light of fact that the conversion layers are typically so thin. As an alternative example, rather than combining the fortifying layer and conversion layer etching steps, it may be desired to combine the conversion layer and central metal foil etching steps, such as by delaying the conversion layer etching step until after the attaching step and performing the conversion layer and metal foil etching steps generally simultaneously.

For those constructions where mechanical fortification is desired (e.g., Cu—Al—Cu), it may be desirable to provide the fortification layers 52/54 made of a metal (e.g., Ni) having a higher flex modulus than that of the second/conductor network metal (e.g., Cu), thus mechanically fortifying the entire circuit structure. This provides a more mechanically robust circuit which can better withstand thermal excursions, bending, impact, and the like. For those constructions where electrical fortification is desired (e.g., Ni—Cu—Ni), the fortification layers 52/54 may be made of a metal (e.g., Au) having a higher electrical conductance than that of the second metal (e.g., Ni), thus electrically fortifying the entire circuit structure. However, it is not required that this be the case; in fact regardless of which metal is used as the third/fortifying metal, the addition of this layer to the air bridge circuit will enhance the overall current carrying capacity of the circuit.

Various other modifications to the present invention may occur to those skilled in the art to which the present invention pertains. For example, the "etching" steps herein include not only chemical etching, but equivalent processes such as plasma etching, laser ablation, and other metal removal steps. Also, the multilayer metal sandwich illustrated in FIG. 3A may be produced by various processes, such as: (1) cladding together the first and second metal layers, followed by a separate cladding operation for attaching the third/fortifying layer; (2) cladding together the first and second metal layers, followed by panel-plating the third/fortifying layer; (3) cladding together the first, second, and third metal layers simultaneously; (4) panel-plating the second metal layers onto the first metal central layer, followed by panel-plating the third/fortifying layers; and so on. Other modifications not explicitly mentioned herein are also possible and within the scope of the present invention. It is the following claims, including all equivalents, which define the scope of the present invention.

What is claimed is:

1. A method for producing a multilayer circuit board having air bridge crossovers, comprising the steps of:
   (a) providing a multilayer metal sandwich comprising a central layer made of a first metal, top and bottom conductor network layers made of a second metal attached to respective top and bottom surfaces of the central layer, and top and bottom fortifying layers made of a third metal attached to the respective top and bottom conductor network layers;
   (b) applying top and bottom etch-resist masks to the top and bottom fortifying layers, respectively, wherein the top and bottom etch-resist masks are configured to correspond to respective predefined top and bottom conductor patterns, the masks further having apertures defined therein through which exposed portions of the fortifying layers and conductor network layers are defined;
   (c) etching away the exposed portions of the fortifying layers;
   (d) etching away the exposed portions of the conductor network layers;
   (e) stripping the top and bottom etch-resist masks;
   (f) attaching the bottom conductor network to a substrate through an electrically insulative adhesive; and
   (g) etching away the central layer except for those portions thereof sandwiched between the top and bottom conductor networks, thereby forming air bridge crossover structures.

2. A method according to claim 1, wherein the third metal has a higher flex modulus and/or a higher electrical conductance than that of the second metal.

3. A method according to claim 1, wherein:
   the bottom conductor network includes a circuit trace and first and second support element pads disposed proximate the circuit trace on opposite sides thereof; and
   the top conductor network includes a bridging element having first and second enlarged ends and at least one constricted portion therebetween, the bridging element being oriented generally transverse to the circuit trace with each enlarged end disposed opposite a respective one of the support element pads.

4. A method according to claim 1, wherein the first, second, and third metals are:
   aluminum, copper, and nickel, respectively; or
   copper, nickel, and gold, respectively; or
   steel, copper, and nickel, respectively.

5. A method for producing a multilayer circuit board having air bridge crossovers, comprising the steps of:
   (a) providing a multilayer metal sandwich comprising a central layer made of a first metal, top and bottom conductor network layers made of a second metal attached to respective top and bottom surfaces of the central layer, and top and bottom fortifying layers made of a third metal attached to the respective top and bottom conductor network layers, wherein the third metal has a higher flex modulus and/or a higher electrical conductance than that of the second metal;
   (b) applying top and bottom etch-resist masks to the top and bottom fortifying layers, respectively, wherein the top and bottom etch-resist masks are configured to correspond to respective predefined top and bottom conductor patterns, the masks further having apertures defined therein through which exposed portions of the fortifying layers and conductor network layers are defined;
   (c) etching away the exposed portions of the fortifying layers;
   (d) etching away the exposed portions of the conductor network layers;
   (e) stripping the top and bottom etch-resist masks;
   (f) attaching the bottom conductor network to a substrate through an electrically insulative adhesive; and
   (g) etching away the central layer except for those portions thereof sandwiched between the top and bottom conductor networks, thereby forming air bridge crossover structures.

6. A method according to claim 5, wherein:
   the bottom conductor network includes a circuit trace and first and second support element pads disposed proximate the circuit trace on opposite sides thereof; and
   the top conductor network includes a bridging element having first and second enlarged ends and at least one constricted portion therebetween, the bridging element being oriented generally transverse to the circuit trace with each enlarged end disposed opposite a respective one of the support element pads.

7. A method according to claim 5, wherein the first, second, and third metals are:
   aluminum, copper, and nickel, respectively; or
   copper, nickel, and gold, respectively; or
   steel, copper, and nickel, respectively.

8. A method for producing a multilayer circuit board having air bridge crossovers, comprising the steps of:
   (a) providing a multilayer metal sandwich comprising a central layer made of a first metal, and top and bottom conductor network layers made of a second metal attached to respective top and bottom surfaces of the central layer;
   (b) attaching top and bottom fortifying layers made of a third metal to the respective top and bottom conductor network layers;
   (c) applying top and bottom etch-resist masks to the top and bottom fortifying layers, respectively, wherein the top and bottom etch-resist masks are configured to correspond to respective predefined top and bottom conductor patterns, the masks further having apertures defined therein through which exposed portions of the fortifying layers and conductor network layers are defined;

(d) etching away the exposed portions of the fortifying layers;

(e) etching away the exposed portions of the conductor network layers;

(f) stripping the top and bottom etch-resist masks;

(g) attaching the bottom conductor network to a substrate through an electrically insulative adhesive; and (h) etching away the central layer except for those portions thereof sandwiched between the top and bottom conductor networks, thereby forming air bridge crossover structures.

9. A method according to claim 8, wherein step (b) comprises plating or cladding the top and bottom fortifying layers onto the respective top and bottom conductor network layers.

10. A method according to claim 8, wherein the third metal has a higher flex modulus and/or a higher electrical conductance than that of the second metal.

11. A method according to claim 8, wherein:

the bottom conductor network includes a circuit trace and first and second support element pads disposed proximate the circuit trace on opposite sides thereof; and the top conductor network includes a bridging element having first and second enlarged ends and at least one constricted portion therebetween, the bridging element being oriented generally transverse to the circuit trace with each enlarged end disposed opposite a respective one of the support element pads.

12. A method according to claim 8, wherein the first, second, and third metals are:

aluminum, copper, and nickel, respectively; or copper, nickel, and gold, respectively; or steel, copper, and nickel, respectively.

* * * * *